(12) United States Patent
Massoner

(10) Patent No.: US 9,641,949 B2
(45) Date of Patent: May 2, 2017

(54) MEMS DEVICE AND METHOD FOR MANUFACTURING THE MEMS DEVICE

(71) Applicant: Infineon Technologies AG, Neubiberg (DE)

(72) Inventor: Johann Massoner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 53 days.

(21) Appl. No.: 14/320,466

(22) Filed: Jun. 30, 2014

(65) Prior Publication Data

US 2015/0381078 A1    Dec. 31, 2015

(51) Int. Cl.
*H02N 1/00*        (2006.01)
*H04R 31/00*       (2006.01)
*H04R 19/00*       (2006.01)
*B81C 1/00*        (2006.01)
*H04R 7/10*        (2006.01)

(52) U.S. Cl.
CPC ....... *H04R 31/003* (2013.01); *B81C 1/00658* (2013.01); *H04R 19/005* (2013.01); *B81B 2201/0257* (2013.01); *B81B 2201/0264* (2013.01); *B81B 2203/0127* (2013.01); *H04R 7/10* (2013.01); *H04R 2307/023* (2013.01)

(58) Field of Classification Search
CPC .......................................................... H02N 1/00
USPC ........................................................... 310/300
See application file for complete search history.

(56) References Cited

U.S. PATENT DOCUMENTS

| | | | |
|---|---|---|---|
| 2011/0180884 A1* | 7/2011 | Lazarus et al. | 257/414 |
| 2011/0298066 A1* | 12/2011 | Kim et al. | 257/418 |
| 2011/0316054 A1* | 12/2011 | Fedder et al. | 257/253 |
| 2014/0145276 A1 | 5/2014 | Rombach | |
| 2014/0270271 A1* | 9/2014 | Dehe et al. | 381/174 |

FOREIGN PATENT DOCUMENTS

KR    20120139744 A    12/2012

* cited by examiner

*Primary Examiner* — Naishadh Desai
(74) *Attorney, Agent, or Firm* — Slater Matsil, LLP

(57) ABSTRACT

A MEMS device and a method for manufacturing a MEMS device are disclosed. In an embodiment the MEMS device comprises a support having a cavity therethrough and a membrane extended over the cavity of the support, wherein the membrane is at least partially reinforced by graphene.

18 Claims, 4 Drawing Sheets

|  | Graphene | Silicon |
|---|---|---|
| Young's modulus | ~1100 GPa | ~160 GPa |
| Fracture strength | 125 GPa | ~2-3 GPa |
| Poisson ratio | 0.16 | 0.26 |
| Thickness (per layer) | 0.335 nm |  |
| Density | 2260 kg/m$^3$ <br> 7.57 x 10$^{-7}$ kg·m$^{-2}$ per layer | 2300 kg/m$^3$ |
| Spring constant | 1...5 N/m @ 2...8 nm thickness |  |

MEMS DEVICE AND METHOD FOR MANUFACTURING THE MEMS DEVICE

TECHNICAL FIELD

Embodiments of the invention relate to a MEMS (MEMS=Micro Electromechanical System) device and a method for manufacturing the MEMS device, more specifically to a MEMS device comprising a membrane that is at least partly reinforced by graphene.

BACKGROUND

MEMS technology can be used for implementing a variety of devices, such as sensors and acoustic actuators. For example, in a MEMS pressure sensor a small membrane displacement can be sensed capacitively against a reference electrode, and in a MEMS microspeaker the membrane can be electrostatically actuated by electrostatic actuation between two stators for providing a large stroke displacement.

SUMMARY

In accordance with one embodiment a MEMS device comprises a support having a cavity therethrough, and a membrane extended over the cavity of the support, wherein the membrane is at least partially reinforced by graphene.

In accordance with another embodiment a method for manufacturing a MEMS device comprises providing a support having a cavity therethrough, providing a membrane extended over the cavity of the support, and reinforcing the membrane at least partially by graphene.

DETAILED DESCRIPTION OF ILLUSTRATIVE EMBODIMENTS

In the following, embodiments of the invention will be described in further detail. Elements shown in the respective figures having the same or a similar functionality will have associated therewith the same reference signs.

Traditionally, MEMS sensors and MEMS acoustic actuators are manufactured in silicon technology. Silicon membranes in MEMS devices are very fragile and can easily be destroyed during handling and with mechanical shock in operation.

Thus, there is a need for providing an improved MEMS device.

Embodiments provide a MEMS device comprising a support having a cavity therethrough, and a membrane extended over the cavity of the support, wherein the membrane is at least partly reinforced by graphene.

Graphene is considered as magic material especially as monolayer or stack of mono layers. Elasticity is around 20% and it seems to be the perfect material to enforce membranes. The idea is to deposit layers of graphene on top or bottom of a membrane (e.g., a poly silicon membrane) to mechanically strengthen such a construction or the anchor points of such a construction. The graphene layer can be structured, for example, with known semiconductors processes.

As a monolayer, graphene is extremely thin, no major degradation of membrane performance is expected although increased stability will be given. Further, a graphene layer is electrically conductive and an enhanced construction may improve the variable capacity sensor.

Figures 1, 2:
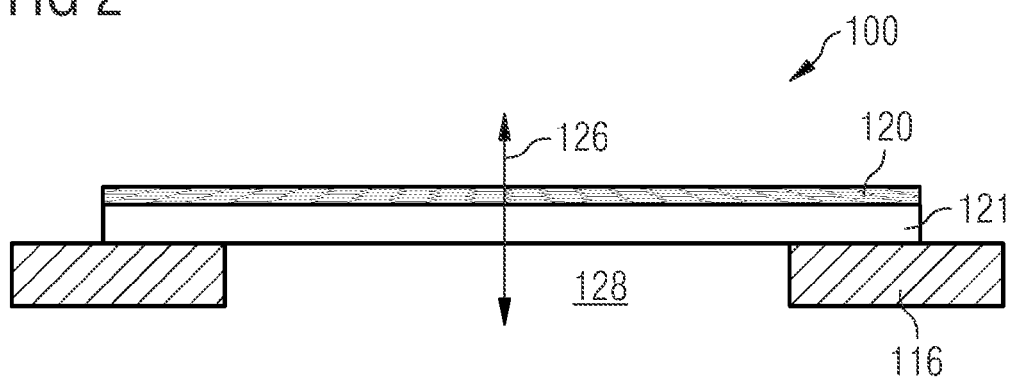
FIG. 1 shows a table indicating the mechanical properties of graphene when compared to silicon.
FIG. 2 shows a cross-sectional view of a MEMS device according to an embodiment.

FIG. 1 shows a table indicating the mechanical properties of graphene when compared to silicon. It can be seen that the graphene outperforms silicon in terms of the values of its Young's modulus, the fracture strength, the Poisson ratio and the density. Therefore, for the reasons outlined above using graphene for reinforcing a membrane is advantageous when realizing sensors or sound actuators in MEMS technology.

FIG. 2 shows a cross-sectional view of a MEMS device 100 according to an embodiment. The MEMS device 100 comprises a support 116 having a cavity 128 therethrough, and a membrane 121 extended over the support cavity 128, wherein the membrane 121 is at least partly reinforced by (or with) graphene 120.

In embodiments, the membrane 121 may comprise a material different than graphene. For example, the membrane 121 may comprise (poly) silicon or may consist of (poly) silicon.

Further, the membrane 121 can be reinforced by a graphene layer 120. The graphene layer 120 may cover the entire membrane 121. Naturally, the graphene layer 120 may cover the membrane 121 also only partially, such as in a suspension area of the membrane 121 (or at anchor points of the membrane 121).

The membrane 121, as depicted by arrow 126, is deflectable in a vertical direction dependent on, for example, pressure changes.

Figure 3:
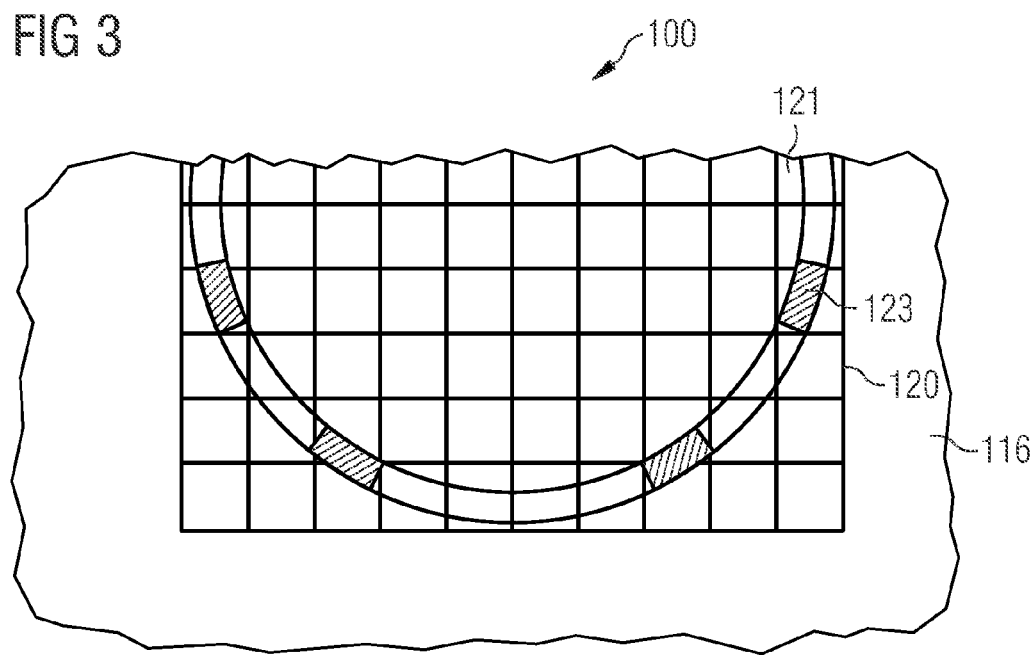
FIG. 3 shows a top view of a section of a MEMS device according to an embodiment.

FIG. 3 shows a top view of a section of a MEMS device 100 according to an embodiment. In FIG. 3, the membrane 121 is reinforced with a graphene layer, depicted by a grid 121 that extends over the membrane 121. The graphene layer 121 may be structured such that the graphene layer covers the membrane 121 only partially. Further, the graphene layer 121 may be structured such that suspension areas (or anchor points) 123 of the membrane 121 are reinforced.

In other words, the MEMS device 100 shown in FIGS. 2 and 3 may comprise a structured or non-structured monolayer or multi-layer graphene reinforcement at the top or bottom side of the membrane 121 or at anchor points 123 of the membrane 121.

In the following, an embodiment of the MEMS device 100 as a pressure sensor will be described. Naturally, the following description is also applicable to the MEMS device 100 described above.

Figure 4:
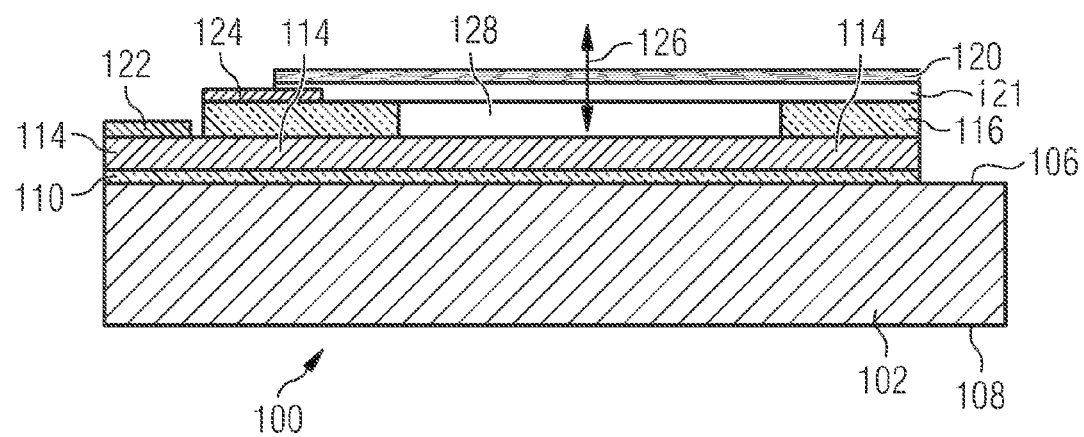
FIG. 4 shows a cross-sectional view of a MEMS pressure sensor according to an embodiment.

FIG. 4 shows a cross-sectional view of a MEMS pressure sensor 100 according to an embodiment. As shown in FIG. 4, the MEMS pressure sensor 100 may further comprise a conductive back plate unit 114, wherein the support 116 may be arranged on the conductive back plate unit 114.

Further, the MEMS pressure sensor 100 may comprise a first electrode 122 and a second electrode 124. The first electrode 122 can be arranged in contact with the conductive back plate unit 114, wherein the second electrode 124 can be arranged in contact with the membrane 121 reinforced with graphene 120. The support 116 shown in FIG. 3 may be a dielectric spacer, i.e. isolating the membrane 121 reinforced with graphene 120 form the conductive back plate unit 114.

Further, the MEMS pressure sensor 100 may comprise a substrate 102 having a front side 106 and a backside 108. The conductive back plate unit 114 may be arranged to extend over the substrate 102. On the front side 106 of the substrate 102 a dielectric spacer 110 may be arranged, wherein the conductive back plate unit 114 may be arranged on the dielectric spacer 110.

The membrane 121 reinforced with graphene 120, the support 116 and the conductive back plate unit 114 may be formed such that the cavity 128 is completely enclosed, such that a gas contained within the cavity 128 may not exhaust or escape. In a MEMS pressure sensor 100 the membrane 121 and the conductive back plate unit 114 may form a capacitor whose capacitance depends on the distance between the membrane 121 and the conductive back plate unit 114. A change of pressure of the environment of the MEMS pressure sensor 100 will lead to a displacement of the membrane 121 that thus can be sensed capacitively.

In the following, embodiments of the MEMS device 100 as an acoustic transducer, such as a microphone or microspeaker, will be described. However, embodiments of the invention are not limited to MEMS acoustic transducers. Rather, the following description is also applicable to the MEMS device 100 described above.

Traditionally, MEMS microphones/microspeakers are manufactured in silicon technology. Silicon micro-machined microphones are capacitive transducers including a flexible membrane moving in the sound field and a static perforated electrode, called back plate. In the case of excessive pressure, the membrane can be subjected to pressure differences of up to 10 bar. In such cases, typical membranes fail.

The reverse transducer is a microspeaker that needs to be actuated such that a large stroke displacement is achieved, for example by a capacitive actuation, to drive a large air displacement and hence acceptable sound pressure.

To address the over pressure problem in silicon microphone membranes it is possible to insert a damping gasket in front of the microphone, however this introduces additional unwanted noise. It is further possible to increase the front volume of the microphone, however this increases the space needed in an application including the microphone. A further possibility for addressing the over pressure problem is to provide a ventilation via a spring supported membrane or by providing a venting passage, however, this requires a special design and low stress gradient of the structure. Another possibility for implementing a ventilation is by flaps in the membrane which open under pressure, however this requires an additional design area and also the stress gradient is critical.

In silicon microspeakers a large sound pressure can be generated by polysilicon membranes comprising pull-in structures, for example by providing a buckling stator speaker.

The mechanical properties of graphene are advantageous for generating microphone membranes of very high compliance and large fracture strength, thereby allowing a design of highly sensitive microphones being robust against any large stroke displacement. On the other hand, microspeakers can benefit from the high compliance in that the actuation voltages for obtaining the high stroke can be reduced, and at the same time the high fracture strength reduces the risk of failure and enables a high durability. In accordance with embodiments, the strength of the membrane can be reinforced with graphene.

Graphene as a pure carbon compound exhibits a high hydrophobicity, which is advantageous to prevent membrane sticking during the manufacturing process which may include a wet processing and also to avoid sticking in the finished device. The hydrophobicity can be modified by partly or fully chemically functionalizing the graphene, for example by fluorination, wherein a full fluorination results in a so called flurographene having an increased hydrophobicity. Also a hydrogenation can be carried out and a full hydrogenation results in a graphene having a moderately increased hydrophilicity. Also oxidation is possible and a full oxidation results in a grapheneoxide having a strongly decreased hydrophobicity. Chemically modified single layer graphene films or composite films consisting of graphene sandwiched in between chemically modified graphene films can also be used in accordance with embodiments.

Figure 5:
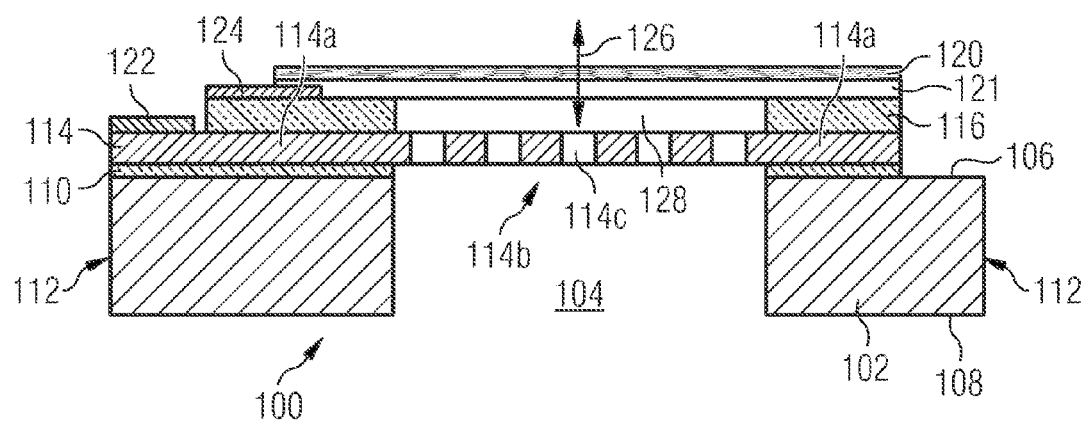
FIG. 5 shows a cross-sectional view of a MEMS microphone comprising a membrane reinforced with graphene according to an embodiment.

FIG. 5 shows a cross-sectional view of a MEMS microphone 100 comprising a membrane 121 reinforced with graphene 120 according to an embodiment. The microphone 100 comprises a substrate 102, for example, a silicon substrate, having a cavity 104 formed therein. The cavity 104 extends from a first surface 106 on the substrate 102 to a second surface 108 of the substrate which is opposite to the first surface. The first surface 106 is also referred to as front side of the substrate 102, and the second surface 108 is also referred to as backside of the substrate 102. On the front side 106 of the substrate a dielectric spacer layer 110 is arranged. The dielectric spacer layer 110 is arranged on the front side 106 of the substrate 102 so as to surround the cavity 104 and to extend from the cavity towards a periphery 112 of the substrate 102. The dielectric spacer layer 110 may extend either all the way to the periphery 112 or may be arranged such that, at specific portions of the substrate, it is recessed from the periphery 112, as shown in the right hand part of FIG. 2. The microphone 100 further comprises a conductive perforated back plate 114 comprising a peripheral region 114a and a perforated region 114b. The back plate 114 may be formed from a polysilicon, and the perforated region 114b comprises a plurality of cavities 114c extending through the back plate 114. The back plate 114 is arranged such that its perforated region 114b is arranged to extend over or across the cavity 104 of the substrate 102, and the peripheral regions 114a of the back plate 114 are arranged on the dielectric spacer layer 110. The microphone 100 comprises a further dielectric spacer layer 116 formed on the peripheral region 114a of the back plate 114. In accordance with embodiments, the dielectric spacer layer 116 does not extend into a region over the cavity 104 and at least partially covers the peripheral region 114a of the back plate 114. The microphone comprises a membrane 121 reinforced with graphene 120 that is supported by the spacer 116 above the back plate. The membrane 121 is arranged above the substrate 104 in such a way that it extends over the cavity 104 and also over the conductive perforated back plate 114. The microphone comprises a first electrode 122 that is in contact with the peripheral region 114a of the back plate 114. Further, a second electrode is in contact with the membrane 121 reinforced by graphene 120. In the embodiment of FIG. 5, the second electrode 124 is arranged on the dielectric spacer in contact with the membrane 121. The membrane 121, as depicted by arrow 126, is deflectable in a vertical direction dependent on pressure changes. By means of the electrodes 122 and 124, which may be formed by respective metal pads, a vertical displacement of the membrane 121 can be detected.

In addition, the MEMS structure depicted in FIG. 5 may be protected against sticking by providing anti-sticking bumps indenting from the back plane into an air gap 128 between the back plate 114 and the membrane 121 reinforced with graphene 120 or by providing the back plate with an anti-sticking coating, like an SAMS coating or an OTS coating.

In the following, an example for manufacturing the microphone 100 depicted in FIG. 5 will be given. The process flow starts with the substrate 102 on top of which a stop oxide layer is deposited, for example with a thickness of 500 nm. A polysilicon layer of a thickness of about 1 μm is deposited on the oxide layer together with a SiN layer having a thickness of for example 100 nm. This layer structure defines the back plate 114. Following the deposition of the materials for the back plate 114, a back plate structuring process is carried out for opening the cavities 114c in the perforated region 114b of the back plate 114. Following the back plate structuring, a dielectric material with a thickness of about 1 to 5 μm is deposited on the back plate and structured to form the further dielectric spacer 116 depicted in FIG. 5. Following the structuring of the spacer 116, the metal pads 122, 124 are formed. Following this, a backside cavity etch of the substrate 102 is carried out, i.e. the cavity 104 is etched from the backside 108 of the substrate towards the front side thereof such that the cavity 104 reaches the stop oxide layer provided on the front side. The stop oxide layer is removed in the area of the cavity by a further etch process. Following this, the membrane 121 is provided by transferring the membrane material (e.g., silicon or poly silicon) to the spacer 116 and to the pad 124. Afterwards, the membrane 121 is reinforced at least partly by graphene, for example, by depositing a graphene layer 120 on the membrane 121.

Note that it is also possible to provide a graphene layer 120 by transferring graphene to the spacer 116 and to the pad 124, and to provide the membrane by transferring the membrane material (e.g., silicon or poly silicon) to the graphene layer 120.

In accordance with an alternative process, the substrate 102, the back plate 114, the spacer 116 and the metal pads 122, 124 are formed as described above, however without structuring the spacer 116. Following this, the backside cavity etch is carried out for forming the cavity 104 from the backside 108 of the substrate 102 without removing the stop oxide layer from the front side. Following this, the membrane material transfer process and the graphene transfer process are carried out. Following this, a sacrificial oxide etch is carried out from the backside of the substrate through the stop oxide layer and the perforation holes 114c, thereby removing the dielectric spacer 116 in the area between the perforated region 114b and the membrane 121, thereby defining the air gap 128.

Figure 6:
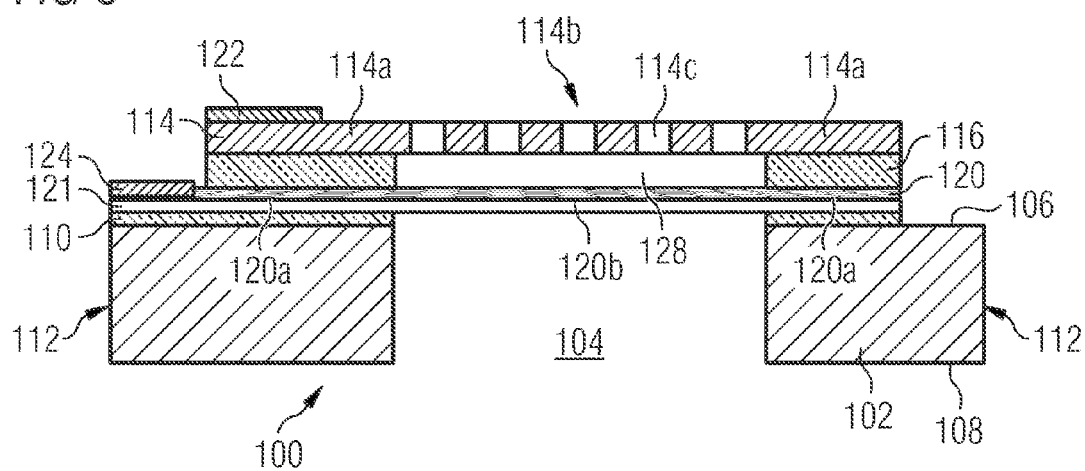
FIG. 6 shows a cross-sectional view of a MEMS microphone having a membrane reinforced with graphene according to another embodiment.

FIG. 6 shows a cross-sectional view of a MEMS microphone 100 having a membrane 121 reinforced with graphene according to another embodiment, which other than FIG. 5 shows a MEMS microphone 100 having the membrane 121 on the bottom. As can be seen from FIG. 6, the structure basically corresponds to the structure of FIG. 5 except that the membrane 121 is now supported by the dielectric spacer 110 that is formed on the substrate 102, and the back plate 114, with the additional spacer 116 arranged between the back plate 114 and the membrane 121 is attached onto the membrane 121, more specifically to the peripheral portions 120a of the membrane supported by the substrate area surrounding the cavity 104. The membrane 121 reinforced with graphene 120 further has a central region 120b extending over the cavity 104. The central region 120b is further arranged opposite the perforated region 114b with the air gap 128 between the membrane 121 and the back plate 114. Thus, in FIG. 6 the membrane 121 reinforced with graphene 120 is sandwiched between the substrate and the back plate.

The MEMES microphone 100 depicted in FIG. 6 may be manufactured by providing the substrate 102, which may be provided with a stop oxide layer defining the layer 110. The membrane material (e.g., silicon or poly silicon) and graphene is deposited onto the substrate 102 or is transferred onto the whole wafer including a plurality of microphone structures to be manufactured followed by a structuring step, unless the membrane has already been structured on the transfer layer. Following this, the spacer 116 is deposited and the back plate 114 is deposited on the spacer as described above and structured. Then the pads 122 and 124 are formed. Following this, in accordance with the first possibility, the cavity 104 is etched from the backside and a portion of the dielectric spacer 116 is removed by a sacrificial oxide etch process for forming the air gap 128. In addition, an anti-sticking coating may be applied to the back plate. Alternatively, the etch process may start with the sacrificial oxide etching for removing a part of the layer 116 for defining the air gap 128 followed by the backside etch for defining the cavity 104 which may include an additional stop oxide etch, provided that such an additional oxide layer 110 has been arranged on the substrate surface. Then, an anti-sticking coating may be applied to the back plate.

Figure 7:
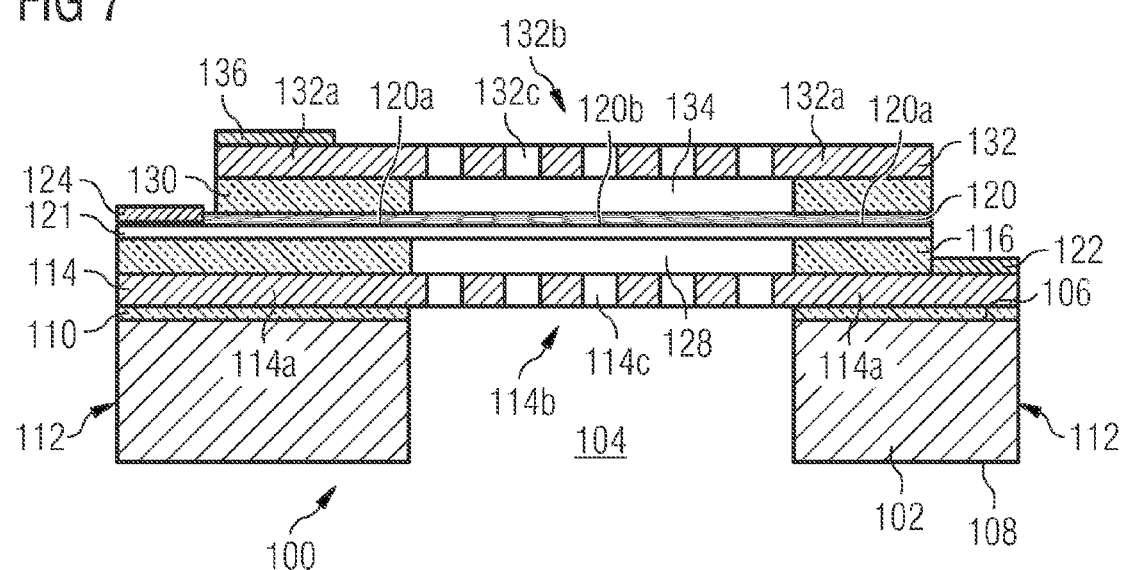
FIG. 7 shows a cross-sectional view of a MEMS microphone according to another embodiment being a combination of the embodiments depicted in FIGS. 5 and 6 in that a double back plate structure is provided including two back plates having the membrane reinforced by graphene sandwiched therebetween.

FIG. 7 shows a cross-sectional view of a MEMS microphone 100 according to another embodiment being a combination of the embodiments depicted in FIGS. 5 and 6 in that a double back plate structure is provided including two back plates having the membrane 121 reinforced by graphene sandwiched therebetween. Elements which have already been described with regard to FIGS. 5 and 6 have been assigned the same reference numbers in FIG. 7 and a new description thereof is omitted. When compared to FIG. 5, the MEMS microphone 100 depicted in FIG. 7 comprises an additional dielectric spacer 130 arranged on the periphery 120a of the membrane 121 reinforced by graphene 120. The spacer 130 supports a further back plate 132 that is similar to the back plate 114 in that it comprises a peripheral region 132a enclosing a perforated region 132b comprising a plurality of cavities or openings 132c. Arranging the back plate 132 in the above described way results in an air gap 134 between an upper surface of the membrane 121 reinforced by graphene 120 and the back plate 132 in the central region 120b of the membrane 121. The further back plate 132 is arranged and structured in such a way that the peripheral region 132a and the perforated region 132b is registered with the respective regions of the back plate 114 and such that also the openings/cavities 132c are registered with the openings 114c. In addition, the further back plate 132 is provided with a further electrode 136 on its peripheral region 132a.

The MEMS microphone 100 depicted in FIG. 7 may be manufactured by combining the process steps defined above with regard to FIGS. 5 and 6.

The above description of embodiments of a MEMS microphone 100 can also be applied to a MEMS microspeaker 100, wherein in contrast to sensing a voltage present at the first and second electrodes 122 and 124, in a MEMS microspeaker 100 a voltage may be applied to the first and second electrodes 122 and 124 in order to electrostatically actuate the membrane 121 reinforced with graphene 120.

In the following embodiments of the invention for manufacturing a MEMS device 100 will be described.

Figure 8:
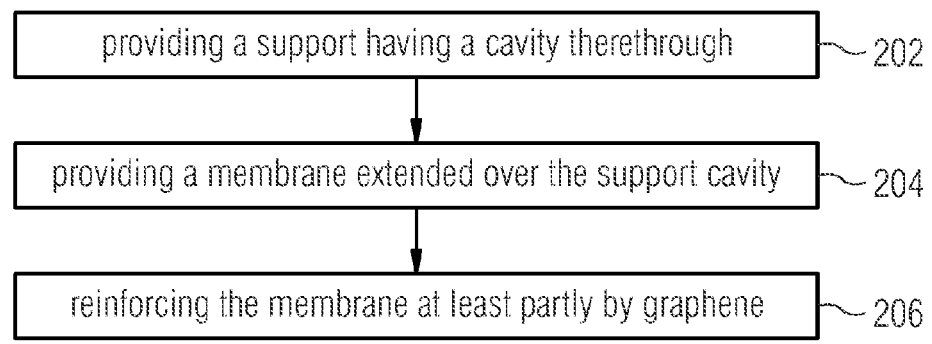
FIG. 8 shows a flowchart of a method for manufacturing a MEMS device according to an embodiment.

FIG. 8 shows a flowchart of a method 200 for manufacturing a MEMS device 100. The method 200 comprises a step 202 of providing a support 116 having a cavity 128 therethrough, a step 204 of providing a membrane 121 extended over the support cavity 128, and a step 206 of reinforcing the membrane 121 at least partly by graphene 120.

In embodiments the step 206 of reinforcing the membrane 121 at least partly by graphene 120 comprises depositing a graphene layer 120 on the membrane 121 such that the membrane 121 is at least partially covered with the graphene layer 120.

Further, the step 206 of reinforcing the membrane 121 at least partly by graphene 120 comprises reinforcing at least a suspension area of the membrane 121.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A MEMS device comprising:
a support having a cavity therethrough; and
a membrane arranged on the support such that the membrane extends over the cavity of the support,
wherein the membrane is at least partially reinforced by graphene,
wherein the membrane is arranged between the support and the graphene, and
wherein the membrane is displaceable over the cavity.

2. The MEMS device according to claim 1, wherein the membrane comprises a material different from graphene.

3. The MEMS device according to claim 1, wherein the membrane comprises poly silicon or consists of poly silicon.

4. The MEMS device according to claim 1, wherein a suspension area of the membrane is reinforced by graphene.

5. The MEMS device according to claim 1, wherein the membrane is reinforced by a graphene layer, and wherein the graphene layer covers the membrane at least partially.

6. The MEMS device according to claim 5, wherein the graphene layer is a single layer graphene or a multilayer graphene.

7. The MEMS device according to claim 1, wherein the support is a dielectric spacer.

8. The MEMS device according to claim 1, further comprising a conductive back plate unit, wherein the support is arranged on the back plate unit.

9. The MEMS device according to claim 8, further comprising a first electrode arranged in contact with the conductive back plate unit and a second electrode arranged in contact with the membrane.

10. The MEMS device according to claim 8, further comprising a substrate, wherein the conductive back plate unit is arranged to extend over the substrate.

11. The MEMS device according to claim 8, wherein the conductive back plate unit comprises a plurality of conductive perforated back plate portions, wherein the support is arranged on the back plate unit between adjacent conductive perforated back plate portions.

12. The MEMS device according to claim 11, further comprising a substrate having a cavity therethrough, wherein the conductive back plate unit is arranged such that the plurality of conductive perforated back plate portions extend over the cavity of the substrate.

13. The MEMS device according to claim 12, wherein the membrane is arranged between the substrate and the conductive back plate unit.

14. The MEMS device according to claim 13, wherein the conductive back plate unit is arranged between the substrate and the membrane.

15. The MEMS device according to claim 11, further comprising a further conductive back plate unit including a plurality of perforated back plate portions and arranged such that the membrane is sandwiched between the conductive back plate unit and the further conductive back plate unit.

16. A method for manufacturing a MEMS device, the method comprising:
providing a support having a cavity therethrough;
providing a membrane on the support such that the membrane extends over the cavity of the support, wherein the membrane is displaceable over the cavity; and
reinforcing the membrane at least partially by graphene.

17. The method according to claim 16, wherein reinforcing the membrane at least partially by graphene comprises depositing a graphene layer on the membrane such that the membrane is at least partially covered with the graphene layer.

18. The method according to claim 16, wherein reinforcing the membrane at least partially by graphene comprises reinforcing at least a suspension area of the membrane.

* * * * *